(12) United States Patent
Rohr et al.

(10) Patent No.: US 7,868,247 B2
(45) Date of Patent: Jan. 11, 2011

(54) PHOTOVOLTAIC DEVICE

(75) Inventors: Carsten Rohr, Oslo (NO); Keith W. J. Barnham, Surrey (GB); Nicholas Ekins-Daukes, London (GB); James P. Connolly, London (GB); Ian M. Ballard, Essex (GB); Massimo Mazzer, Parma (IT)

(73) Assignee: Imperial Innovations Ltd., London (GB)

( * ) Notice: Subject to any disclaimer, the term of this patent is extended or adjusted under 35 U.S.C. 154(b) by 0 days.

(21) Appl. No.: 12/078,315

(22) Filed: Mar. 28, 2008

(65) Prior Publication Data

US 2008/0251118 A1   Oct. 16, 2008

Related U.S. Application Data

(63) Continuation of application No. 09/955,297, filed on Sep. 19, 2001, now abandoned.

(30) Foreign Application Priority Data

Jul. 25, 2001   (GB)   .................................. 0118150.2

(51) Int. Cl.
H01L 31/00   (2006.01)
(52) U.S. Cl. ....................................................... 136/255
(58) Field of Classification Search .......... 136/243–265
See application file for complete search history.

(56) References Cited

U.S. PATENT DOCUMENTS

| | | | |
|---|---|---|---|
| 4,094,704 A | 6/1978 | Milnes | |
| 4,128,733 A | 12/1978 | Fraas et al. | |
| 4,295,002 A | 10/1981 | Chappell et al. | |
| 4,341,918 A | 7/1982 | Evans, Jr. et al. | |

(Continued)

FOREIGN PATENT DOCUMENTS

| | | |
|---|---|---|
| EP | 0 848 433 A2 | 6/1998 |
| JP | 58-191479 | 11/1983 |
| JP | 59-138387 | 8/1984 |
| JP | 60-260166 | 12/1985 |
| JP | 06-291347 | 10/1994 |

(Continued)

OTHER PUBLICATIONS

Ekins-Daukes, An investigation into the efficiency of strained and strain-balanced quantum well solar cells, 1999, Imperial College, London, UK, pp. 20, 24-28, 100-102, 112-114,142-143.*

(Continued)

Primary Examiner—Jessica L Ward
Assistant Examiner—Kevin E Yoon
(74) Attorney, Agent, or Firm—Foley & Lardner LLP (57) ABSTRACT

A method of forming a photovoltaic device includes a plurality of quantum wells and a plurality of barriers. The quantum wells and barriers are disposed on an underlying layer. The barriers alternate with the quantum wells. One of the plurality of quantum wells and the plurality of barriers is comprised of tensile strained layers and the other of the plurality of quantum wells and the plurality of barriers is comprised of compressively strained layers. The tensile and compressively strained layers have elastic properties. The method includes selecting compositions and thicknesses of the barriers and quantum wells taking into account the elastic properties such that each period of one tensile strained layer and one compressively strained layer exerts substantially no shear force on a neighboring structure; providing the underlying layer; and forming the quantum sells and barriers on the underlying layer according to the derived compositions and thicknesses.

40 Claims, 5 Drawing Sheets

U.S. PATENT DOCUMENTS

| | | | |
|---|---|---|---|
| 4,542,256 | A | 9/1985 | Wiedeman |
| 4,568,958 | A | 2/1986 | Baliga |
| 4,632,712 | A | 12/1986 | Fan et al. |
| 4,667,059 | A | 5/1987 | Olson |
| 4,688,068 | A | 8/1987 | Chaffin et al. |
| 5,011,550 | A | 4/1991 | Konushi et al. |
| 5,322,573 | A | 6/1994 | Jain et al. |
| 5,342,451 | A | 8/1994 | Virshup |
| 5,458,694 | A | 10/1995 | Nuyen |
| 5,496,415 | A | 3/1996 | Barnham |
| 5,517,339 | A | 5/1996 | Riccobono et al. |
| 5,626,687 | A | 5/1997 | Campbell |
| 5,851,310 | A | 12/1998 | Freundlich et al. |
| 5,902,417 | A | 5/1999 | Lillington et al. |
| 6,008,507 | A | 12/1999 | Lin et al. |
| 6,147,296 | A | 11/2000 | Freundlich |
| 6,150,604 | A | 11/2000 | Freundlich et al. |
| 6,154,034 | A | 11/2000 | Lovelady et al. |
| 6,239,354 | B1 | 5/2001 | Wanlass |
| 6,307,873 | B1 | 10/2001 | Geels et al. |
| 6,372,980 | B1 | 4/2002 | Freundlich |
| 6,597,017 | B1 | 7/2003 | Seko et al. |
| 2003/0089392 | A1 | 5/2003 | Rohr et al. |
| 2004/0246596 | A1 | 12/2004 | Dyson et al. |
| 2005/0155641 | A1 | 7/2005 | Fafard |
| 2005/0247339 | A1 | 11/2005 | Barnham et al. |

FOREIGN PATENT DOCUMENTS

| | | |
|---|---|---|
| JP | 2002-368238 | 12/2002 |
| WO | WO 93/08606 | 4/1993 |
| WO | WO 03/012881 A1 | 2/2003 |
| WO | WO 03/073517 A1 | 9/2003 |
| WO | WO 03/100868 A1 | 12/2003 |

OTHER PUBLICATIONS

Renaud et al., "Modeling p-i(Multi Quantum Well)-n Solar Cells: A Contribution for a Near Optimum Design," *First WCPEC*, pp. 1787-1790 (1994).

Office Action cited in related U.S. Appl. No. 10/841,843 dated Aug. 5, 2009.

Johnson et al., "Advances in Bragg Stack Quantum Well Solar Cells," *Solar Energy Materials & Solar Cells*, pp. 1-11 (2004).

U.S. Appl. No. 10/841,843 (pending), filed May 10, 2004, Barnham et al.

U.S. Appl. No. 12/076,956 (pending), filed Sep. 26, 2006, Barnham et al.

U.S. Appl. No. 09/955,297 (abandoned), filed Sep. 19, 2001, Barnham et al.

Andreev, et al., "Thermophotovoltaic Cells with Sub-Bandgap Photon Recirculation" in Proceedings of the 17th European Photovoltaic Solar Energy Conference, pp. 219-222 (2001).

Ballard et al., "The Effect of Temperature on the Efficiency of Multi-Quantum Well Solar Cells," $2^{nd}$ World Conf. and Exhibition on Photovoltaic Solar Energy Conversion, pp. 3624-3626 (1998).

Barnes et al., "Gallium Arsenide/Indium Gallium Arsenide Multi-Quantum Well Solar Cells," $12^{th}$ European Photovoltaic Solar Energy Conference, pp. 1374-1377 (1994).

Barnham et al., "A New Application for III-V Quantum Well System-Efficiency Enhancement in Solar Cells," *Inst. Phys. Conf. Ser. No. 120: Chap. 10*, pp. 511-514 (1991).

Barnham et al., "A Novel Approach to Higher Efficiency-The Quantum Well Solar Cell," $11^{th}$ *E.C. Photovoltaic Solar Energy Conference*, pp. 146-149 (1992).

Barnham et al., "Quantum Well Solar Cells," *Optoelectronics*, vol. 9, No. 4, pp. 483-498 (1994).

Barnham et al., "Quantum-Well Solar Cells," *MRS Bulletin*, vol. XVIII, No. 10, pp. 51-54 (1993).

Barnham, "A New Approach to High-Efficiency Multi-Band-Gap Solar Cells," *J. Appl. Phys.*, 67 (7), pp. 3490-3493 (1990).

Barnham et al., "Short-Circuit Current and Energy Efficiency Enhancement in a Low-Dimensional Structure Photovoltaic Device," *Appl. Phys. Lett.*, 59 (1), pp. 135-137 (1991).

Barnham et al., "The LDS Solar Cell—A New Approach to Higher Efficiency," pp. 104-106 (1991).

Barnham et al., "Observation of Ideal Dark-Current Behaviour in Strain-Balanced Quantum Well Solar Cells," $19^{th}$ European Photovoltaic Solar Energy Conference, pp. 328-331, (2004).

Barnham et al., "Recent Results on Quantum Well Solar Cells," Proc. $3^{rd}$ World Conference on Photovoltaic Energy conversion, pp. 606-611 (2003).

Barnham et al., "Quantum Well Solar Cells," Physica E 14, pp. 27-36 (2002).

Barnham et al., "Quantum Well Solar Cells and Quantum Dot Concentrators," *Nanostructured Materials for Solar Energy Conversion*, pp. 517-537 (2006).

Barnham et al., Voltage Enhancement in Quantum Well Solar Cells, *American Institute of Physics*, pp. 1201-1206 (1996).

Bennett, AI, et al, "An Integrated High-Voltage solar cell"; 6th IEEE Photovoltaic Specialist Conference, pp. 148-159, (1967).

Bertness et al., "29.5% -Efficient GaInP/GaAs Tandem Solar Cells," *App. Phys. Lett.*, 65 (8), pp. 989-991 (1994).

Borden, P.G., "A Monolithic series-connected AlGaAs/GaAs Solar Cell Array", in Proceedings of the 14th Photovoltaic Specialist Conference, pp. 554-562, (1980).

Bushnell et al., "Short-Circuit Current Enhancement in Bragg Stack Multi- Quantum-well Solar Cells for Multi-Junction Space Cell Applications," *Solar Energy Materials & Solar Cells 75* pp. 299-305 (2003).

Chiang, S.-Y., et at., "Thin Tandem Junction Solar Cell," 13th IEEE Photovoltaic Specialist Conference,. New York: IEEE, pp. 1290-1293, (1978).

Connolly et al., "Modelling Multi Quantum Well Solar Cell Efficiency," Proc. $16^{th}$ European Conf. and Exhibition on PV Solar Energy, pp. 204-207 (2001).

Dalal et al., "Design Considerations for High-Intensity Solar Cells," *Journ. of Applied Physics*, vol. 48, No. 3, pp. 1244-1251 (1977).

Davies, P. A., et al., "Solar Thermophotovoltaics: Brief Review and a New Look" Solar Energy Materials and Solar Cells, Elsevier Science Publishers, Amsterdam, NL, vol. 33, No. 1, pp. 11-22 (1994).

Dimroth et al., "MOVPE Grown $GA_{1-x}In_xAs$ Solar Cells for GaInP/GaInAs Tandem Applications," *Journ. of Electronic Materials*, vol. 29, No. 1, pp. 42-46 (2000).

Ekins-Daukes et al., "Strain-balanced GaAsP/InGaAs Quantum Well Solar Cells," *Applied Physics Letters*, vol. 75, No. 26, pp. 4195-4197 (1999).

Ekins-Daukes et al., "Strained and Strain-Balanced Quantum Well Devices for High-Efficiency Tandem Solar Cells," Solar Energy Materials & Solar Cells 68, pp. 71-87 (2001).

Ekins-Daukes et al., "Strain-Balanced Materials for High-Efficiency Solar Cells," pp. 1273-1276 (2000).

First World Conference on Photovoltaic Energy Conversion, Dec. 5-9, 1994, 3 pgs., Preliminary Program-First World Conference on Photovoltaic Energy Conversion, Program pp. 2, 46 and 49 (1994).

Green et al., "Solar Cell Efficiency Tables (Version 23)," Progress in Photovoltaics: Research and Applications, Prog. Photovolt: Res. Appl. 2004; 12, pp. 55-62 (2004).

Griffin et al., "Effect of Strain Relaxation on Forward Bias Dark Currents in GaAs/InGaAs Multiquantum Well p-i-n Diodes," *J. Appl. Phys.* 80 (10), pp. 5815-5820 (1996).

Griffin et al., "The Application of Quantum Well Solar Cells to Thermophotovoltaics," *Solar Energy Materials and Solar Cells* 50, pp. 213-219 (1998).

Haarpaintner et al., "Voltage Performance of Quantum Well Solar Cells in the $Al_xGa_{1-x}As/GaAs$ and the $GaAs/In_yGa_{1-y}As$ Material Systems," pp. 1783-1786, (1994).

Henry, "Limiting Efficiencies of Ideal Single and Multiple Energy Gap Terrestrial Solar Cells," *J. Appl. Phys.* 51(8), pp. 4494-4500 (1980).

Hoffman et al., "Localization Effects in InGaAs N Multi-quantum Well Structures," *Materials Science and Engin.*, B93, pp. 55-59 (2002).

Ichikawa et al., "Large-Area Amorphous Silicon Solar Cells with High Stabilized Efficiency and Their Fabrication Technology," pp. 27-33 (1993).

Katsuyama et al., "New Approaches for High Efficiency Cascade Solar Cells," *Solar Cells*, vol. 21, pp. 413-418 (1987).

King et al., "Lattice-Matched and Metamorphic GaInP/GaInAs/Ge Concentrator Solar Cells," *Presented at the 3rd World Conf. on Photovoltaic Energy Conversion*, pp. 4 pgs. (2003).

Kittl, E. et al., "Performance of Germanium PIN-photovoltaic cells at high incident radiation intensity"; 11th IEEE Photovoltaic Specialist Conference, pp. 424-430, (1975).

Krut, D., et al., "Monolithic multi-cell GaAs laser power converter with very high current density", in Conference Record of the Twenty-Ninth IEEE Photovoltaic Specialists Conference, pp. 908-911, (2002).

Kurtz et al., Projected Performance of Three-and Four-Junction Devices Using GaAs and GaInP, pp. 875-878 (1997).

Kurtz et al., "High Efficiency GaAs Solar Cells Using GaInP$_2$ Window Layers," pp. 138-140 (1990).

Luque et al., "Handbook of Photovoltaic Science and Engineering," The Physics of the Solar Cell, pp. 74-77 (2003).

Mulligan et al., "A flat-plate concentrator: Micro-concentrator design overview" in Conference Record of the Twenty-Eighth IEEE Photovoltaic Specialists Conference—2000, IEEE Photovoltaic Specialists Conference, pp. 1495-1497, (2000).

Mulligan et at., "Development of chip-size silicon solar cells" in Conference Record of the Twenty-Eighth IEEE Photovoltaic Specialists Conference—2000, IEEE Photovoltaic Specialists Conference, pp. 158-163, (2000).

Nagashima et al., "A germanium back-contact type cell for thermophotovoltaic applications", in Proceedings of 3rd World Conference on Photovoltaic Energy Conversion, vols. a-C, pp. 200-203, (2003).

Nagashima et at., "Carrier recombination Recombination of Germanium Back-contact type bottom cells for three-terminal tandem solar cells"; proceedings of the 17th European Photovoltaic solar energy conference, Munich, Germany, pp. 2203-2206 (2001).

Nelson et al., "Quantum Well Solar Cell Dark Currents," 12th European Photovoltaic Solar Energy Conference, pp. 1370-1373 (1994).

Nelson et al., "Steady-State Carrier Escape from Single Quantum Wells," *IEEE Journ. of Quantum Electronics*, vol. 29, No. 6, pp. 1460-1468 (1993).

Nelson, "Quantum-Well Structures for Photovoltaic Energy Conversion," Thin Films, vol. 21, pp. 311-368 (1995).

Nelson et al., "Observation of Suppressed Radiative Recombination in Single Quantum Well p-i-n Photodiodes," *J. Appl. Phys.* 82 (12), pp. 6240-6246 (1997).

Posthuma N.E., et al, "Surface Passivation for Germanium Photovoltaic Cells"; Solar Energy Materials and Solar Cells, vol. 88, Issue 1, pp. 37-45, (2005).

Rohr et al., Strain-Balanced $In_{0.62}Ga_{0.38}As/In_{0.47}Ga_{0.53}As$ (InP) Quantum Well Cell for Thermophotovoltaics, pp. 1234-1237 (2000).

Shimokawa, R., et al., "Supplementary-Light method for Measuring the Conversion Efficiency of Multijunction Solar Cells" Japanese Journal of Applied Physics, Japan Society of Applied Physics, Tokyo JP, vol. 28, No. 5, Part 2, pp. L845-L848 (1989).

Shockley et al., "Detailed Balance Limit of Efficiency of p-n Junction Solar Cells," *Journ. of Applied Physics*, vol. 32, No. 3, pp. 510-519 (1961).

Stanchina et al., "Handbook of Semiconductor Technology," vol. 2, pp. 392-406 (2000).

Sze, "The Physics of Semiconductor Devices", 2nd Edition, pp. 84-93, (1981).

Terao, A et al., "Mechanically Stacked Cells for Flat-Plate Micro-Concentrators", in Proceedings of 19th European Photovoltaic Solar Energy Conference, Paris, France, pp. 2285-2288 (2004).

Tibbits et al., "The Potential for Strain-Balanced Quantum Well Solar Cells in Terrestrial Concentrator Applications," 3rd World Conference on Photovoltaic Energy Conversion, pp. 2718-2721 (2003).

Tobin et al., "High-Efficiency GaAs/Ge Monolithic Tandem Solar Cells," IEEE Electron Device Letters, vol. 9, No. 5, pp. 256-258 (1988).

van Riesen, S. et al., "Fabrication of MIM-GaAs solar cells for high concentration PV", in Proceedings of 3rd World Conference on Photovoltaic Energy Conversion, vols. A-C, pp. 833-836 (2003).

Ward et al., "GaInAsP Solar Cells with the Ideal Band Gap for Terrestrial Concentrator Applications," pp. 650-654 (1993).

Wojtczuk, "Comparison of Windows for P-ON-N InGaP Solar Cells," pp. 655-658 (1993).

Zachariou, Characterisation of InP/InGaAs Quantum Well Solar Cells, pp. 1-70, (1993).

International Search Report for PCT/GB2006/003574, mailed May 4, 2007, 4 pgs.

International Search Report for PCT/GB02/003378, mailed Oct. 21, 2002, 4 pgs.

Great Britain Search Report for Great Britain Application No. 0519599.5 dated Jan. 12, 2006, 1 pg.

Office Action for U.S. Appl. No. 10/841,843 dated Feb. 22, 2007, 24 pgs.

Office Action for U.S. Appl. No. 10/841,843 dated Aug. 24, 2007, 26 pgs.

Office Action for U.S. Appl. No. 10/841,843 dated May 12, 2008, 26 pgs.

Office Action for U.S. Appl. No. 09/955,297, dated Jan. 27, 2003, 25 pgs.

Office Action for U.S. Appl. No. 09/955,297, dated Aug. 2, 2002, 23 pgs.

Office Action for U.S. Appl. No. 09/955,297, dated Aug. 27, 2003, 27 pgs.

Office Action for U.S. Appl. No. 09/955,297, dated Jan. 21, 2004, 29 pgs.

K. Barnham et al., "Quantum Well Solar Cells," Applied Surface Science 113/114, pp. 722-733 (1997).

C. Rohr et al., Optimisation of InGaAsP Quantum Well Cells for Hybrid Solar-Thermophotovoltaic Applications, American Institute of Physics, pp. 83-92 (1999).

N. S. Fatemi et al., InGaAs Monolithic Interconnected Modules (MIMs), pp. 799-804 (1997).

M. Paxman et al., Modeling the Spectral Response of the Quantum Well Solar Cell, J. Appl. Phys. 74, pp. 614-621 (1993).

C. Rohr et al., "Potential of InGaAsP Quantum Well Cells for Thermophotovoltaics," In Proc. 26th International Symposium on Compound Semiconductors No. 166 in Institute of Physics Conference Series (Institute of Physics Publishing, Bristol and Philadelphia, 2000), pp. 423-426 (1999).

A. W. Bett et al., "Large-Area GaSb Photovoltaic Cells," Thermophotovoltaic Generation of Electricity: Third NREL Conf., vol. 401 of AIP Conf. Proc. (American Institute of Physics, Woodbury, N.Y.), pp. 41-53 (1997).

L. Ferguson et al., "Matched Infrared Emitters for Use with GaSb TPV Cells," Thermophotovoltaic Generation of Electricity: Third NREL Conference vol. 401 of AIP Conf. Proc. (American Institute of Physics, Woodbury, N.Y.), pp. 169-179 (1997).

Johnson et al., "Observation of Photon recycling in Strain-Balanced Quantum Well Solar Cells," Applied Physics Letters 90, pp. 213505(1)-213505(3), (2007).

M. F. Rose et al., "Selective Emitters for Thermophotovoltaic Power Systems for Use in Aerospace Applications," Journal of Propulsion and Power, vol. 12, No. 1, pp. 83-88 (1996).

Wilt et al., "0.55eV n/p/n MIM TPV Cell Development," 28th IEEE PVSC, pp. 1024-1027 (2000).

Tobin et al., "Device Processing and Analysis of High Efficiency GaAs Cells," *Solar Cells*, 24, pp. 103-115 (1988).

Response filed on Mar. 1, 2010 to the Non-Final Office Action from related U.S. Appl. No. 12/076,956, dated Jan. 29, 2010, including Office Action dated Jan. 29, 2010 (12 pgs).

Office Action from related U.S. Appl. No. 12/076,956, dated May 10, 2010, (14 pgs).

Office Action from related U.S. Appl. No. 10/841,843, dated Feb. 23, 2010, (19 pgs.).

Response filed on Dec. 7, 2009 to the Office Action dated Aug. 5, 2009, from related U.S. Appl. No. 10/841,843, (15 pgs.).

* cited by examiner

PHOTOVOLTAIC DEVICE

CROSS-REFERENCE TO RELATED PATENT APPLICATIONS

The present application is a Continuation of U.S. patent application Ser. No. 09/955,297 filed Sep. 19, 2001, which claims priority to Great Britain Patent Application 0118150.2 filed Jul. 25, 2001. The entire disclosures of U.S. patent application Ser. No. 09/955,297 and Great Britain Patent Application 0118150.2 are incorporated by reference herein, including the claims, specifications, abstracts, and drawings thereof.

BACKGROUND

This invention relates to an improved photovoltaic device/cell for the conversion of heat radiation into electricity.

Thermophotovoltaics (TPV) is the use of photovoltaic (PV) cells to convert heat radiation, e.g. from the combustion of fossil fuels or biomass, into electricity. The energy spectrum is often reshaped using selective emitters which absorb the heat and re-emit in a narrow band. The re-emitted radiation may be efficiently converted to electric power using a PV cell of appropriate low band-gap. Higher PV cell efficiencies can be achieved by introducing multi-quantum-wells (MQW) into the intrinsic region of a p-i-n diode if the gain in short-circuit current exceeds the loss in open-circuit voltage [K. W. J. Bartham and G. Duggan, J. Appl. Phys. 67, 3490 (1990). K. Barnham et al., Applied Surface Science 113/114, 722 (1997). K. Barnham, International Published Patent Application WO-A-93/08606 and U.S. Pat. No. 5,496,415 (1993)]. A Quantum Well Cell (QWC) in the quaternary system InGaAsP lattice-matched to InP substrates is a promising candidate for TPV applications as the effective band-gap can be tuned, out to about 1.65 μm ($In_{0.53}Ga_{0.47}As$), without introducing strain, by varying the well depth and width, to match a given spectrum. The enhancement in output voltage of a QWC is a major advantage for TPV applications [P. Griffin et al., Solar Energy Materials and Solar Cells 50, 213 (1998). C. Rohr et al., in Thermophotovoltaic Generation of Electricity: Fourth NREL Conf., Vol. 460 of AIP Conf. Proc. (American Institute of Physics, Woodbury, N.Y., 1999), pp. 83-92].

There is considerable interest in extending the absorption to longer wavelengths for higher overall system efficiencies with lower temperature sources; and lower temperature fossil sources have also lower levels of pollution. Appropriate and inexpensive substrates of the required lattice constant and band-gap are not available, so the lower band-gap material is often strained to the substrate, introducing dislocations which increase non-radiative recombination. Freundlich et al. have proposed strained quantum well devices [U.S. Pat. No. 5,851,310 (1998), U.S. Pat. No. 6,150,604 (2000)], but these can only incorporate a restricted number of wells without creating dislocations. Freundlich proposes limiting the number of wells to a maximum of 20, which will not produce sufficient absorption for efficient generation however. In a MQW system, these dislocations can be reduced by strain-balancing the layers; alternating barriers and wells have bigger and smaller lattice-constants, but on average are lattice-matched to the substrate [N. J. Ekins-Daukes et al., Appl. Phys. Lett. 75, 4195 (1999)].

SUMMARY

An exemplary embodiment relates to a method of forming a photovoltaic device that includes a plurality of quantum wells and a plurality of barriers. The quantum wells and barriers are disposed on an underlying layer. The barriers alternate with the quantum wells. One of the plurality of quantum wells and the plurality of barriers is comprised of tensile strained layers and the other of the plurality of quantum wells and the plurality of barriers is comprised of compressively strained layers. The tensile and compressively strained layers have elastic properties. The method includes selecting compositions and thicknesses of the barriers and quantum wells taking into account the elastic properties such that each period of one tensile strained layer and one compressively strained layer exerts substantially no shear force on a neighboring structure; providing the underlying layer; and forming the quantum sells and barriers on the underlying layer according to the derived compositions and thicknesses.

Another exemplary embodiment relates to a photovoltaic device that includes an underlying layer and a multiple quantum well portion formed of a plurality of quantum wells and a plurality of barriers disposed on the underlying layer such that the barriers alternate with the quantum wells. One of the plurality of quantum wells and the plurality of barriers is comprised of tensile strained layers and the other of the plurality of quantum wells and the plurality of barriers is comprised of compressively strained layers. The tensile and compressively strained layers have elastic properties. The tensile strained layers and the compressively strained layers have compositions and thicknesses that are selected taking into account the elastic properties such that each period of one tensile strained layers and one compressively strained layers exerts substantially no shear force on a neighboring structure.

Another exemplary embodiment relates to a photovoltaic device having a multiple well quantum portion formed upon a virtual substrate having a virtual substrate lattice constant that is different than a substrate lattice constant of an underlying substrate. The virtual substrate is $InP_{1-x}As_x$ where $0<x<1$ and the substrate is InP.

Another exemplary embodiment relates to a photovoltaic device having a multiple quantum well portion formed of strained alternating quantum well layers of $In_xGa_{1-x}As$, where $x>0.53$, and barrier layers of $Ga_yIn_{1-y}P$, where $y>0$.

Another exemplary embodiment relates to a photovoltaic device that includes a plurality of quantum wells and a plurality of barriers, the barriers alternating with the quantum wells. One of the plurality of quantum wells and the plurality of barriers is comprised of tensile strained layers and the other of the plurality of quantum wells and the plurality of barriers is comprised of compressively strained layers. The tensile strained layers and the compressively strained layers have compositions such that a period of one tensile strained layer and one compressively strained layer exerts substantially no shear force on a neighboring structure.

DETAILED DESCRIPTION

According to an exemplary embodiment, a photovoltaic device has a multiple quantum well portion with alternating tensile strained layers and compressively strained layers, said tensile strained layers and said compressively strained layers having compositions such that a period of one tensile strained layer and one compressively strained layer exerts substantially no shear force on a neighboring structure.

The inventors have recognized that rather than seeking to provide an average lattice constant that matches the substrate, what is truly important is to balance the forces in the tensile and compressively strained layer to provide an average or effective zero stress system. A device providing an average lattice constant matching the substrate may still allow a significant build up of stress that will result in undesirable dislocations.

With this concept one can extend the absorption threshold to longer wavelength without introducing dislocations.

With a strain-balanced multi-quantum-well stack in the intrinsic region of a two-terminal photovoltaic device the absorption threshold can be extended to longer wavelengths. In particular, with high bandgap barriers the dark current can be reduced at the same time, and hence the conversion efficiency is increased significantly.

What is also helpful to achieve higher conversion efficiencies is an improved voltage performance, due to a lower dark current. This is provided by the higher barriers which may also be provided when balancing the strain.

According to another exemplary embodiment, a photovoltaic device has a multiple well quantum portion formed upon a virtual substrate having a virtual substrate lattice constant different than a substrate lattice constant of an underlying substrate, wherein said virtual substrate is $InP_{1-x}As_x$, where $0<x<1$ and said substrate is InP.

Using an $InP_{1-x}As_x$ based virtual substrate allows lattice matching to a quantum well system having a relatively large lattice constant, and typically desirable low bandgap.

According to another exemplary embodiment, a photovoltaic device has a multiple quantum well portion formed of strained alternating quantum well layers of $In_xGa_{1-x}As$, where x>0.53, and barrier layers of $Ga_yIn_{1-y}P$, where y>0.

This combination of layers allows provision of an advantageously high barrier energy within the multiple quantum well system which reduces the dark current. Furthermore, this composition is well suited to stress balancing and use with the above mentioned virtual substrate.

A photovoltaic cell to convert low energy photons is described, consisting of a p-i-n diode with a strain-balanced multi-quantum-well system incorporated in the intrinsic region. The bandgap of the quantum wells is lower than that of the lattice-matched material, while the barriers have a much higher bandgap. The high band-gap barriers reduce the dark current. Hence the absorption can be extended to longer wavelengths, while maintaining a low dark current. This leads to greatly improved conversion efficiencies, particularly for low energy photons from low temperature sources. This can be achieved by strain-balancing the quantum wells and barriers, where each individual layer is below the critical thickness and the strain is compensated by quantum wells and barriers being strained in opposite directions. The strain is compensated by choosing the material compositions and thicknesses of the layers in such a way that the average stress is zero, taking into account the elastic properties of the materials. Thereby the creation of misfit dislocations, which are detrimental to the dark current and hence to the cell conversion efficiency, can be avoided. The number of quantum wells that can be incorporated is therefore not limited by the build-up of strain, but only by the size of the i-region, and is typically 30-60 [This is an important advantage over Freundlich's strained QWs with a maximum number of about 20 (see U.S. Pat. No. 5,851,310 and U.S. Pat. No. 6,150,604)]. The width of the i-region is limited by the electric field that needs to be maintained across it.

The absorption can be further extended to longer wavelengths by introducing a strain-relaxed layer (virtual substrate) between the substrate and the active cell. The device is then grown on this virtual substrate and the layers are strain-balanced with respect to the new lattice constant. This allows one to effectively move to a specific lattice constant which is associated with a desired band gap for the lattice matched and strain-balanced materials. This is of particular interest for thermophotovoltaic applications with lower temperature sources, as one can extend the absorption towards the required long wavelengths.

As an example for a strain-compensated QWC, we consider a 30 well $In_{0.62}Ga_{0.38}As/In_{0.47}Ga_{0.53}As$ (InP) QWC, grown by MOVPE, whose sample description is given in Table I.

TABLE I

Sample description of a strain-compensated quantum well cell.

| Layers | Thickness (Å) | Material | Function | Doping | Conc. (cm$^{-3}$) |
|---|---|---|---|---|---|
| 1 | 1000 | $In_{0.53}Ga_{0.47}As$ | Cap | p | 1E+19 |
| 1 | 7000 | InP | Emitter | p | 2E+18 |
| 30 | 120 | $In_{0.45}Ga_{0.55}As$ | Barrier | i | |
| 30 | 120 | $In_{0.62}Ga_{0.38}As$ | Well | i | |
| 1 | 120 | $In_{0.47}Ga_{0.53}As$ | Barrier | i | |
| 1 | 5000 | InP | Base | n | 1E+18 |
| | | InP | Substrate | n | |

Figure 1:
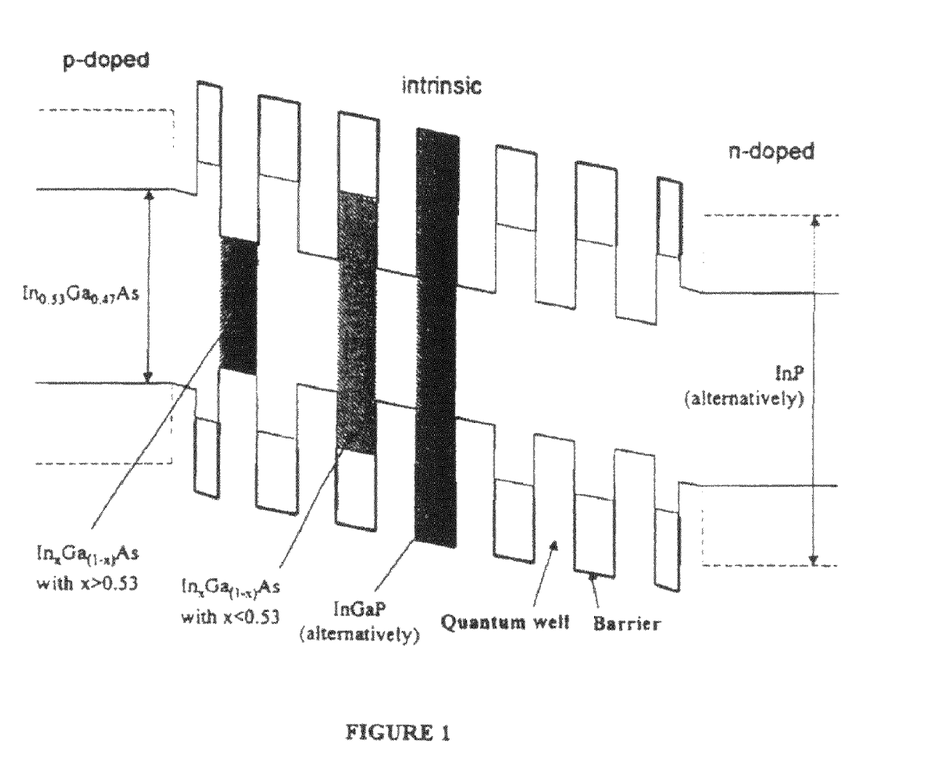
FIG. 1 is a bandgap diagram of a strain-balanced quantum well cell. The p- and n-regions are made of material that is lattice-matched to the InP substrate, e.g. $In_{0.53}Ga_{0.47}As$ or InP. The quantum wells are made of $In_xGa_{1-x}As$ with $x>0.53$, and the barrier of $In_xGa_{1-x}As$ with $x<0.53$, GaInP or InGaAsP.
Figure 2:
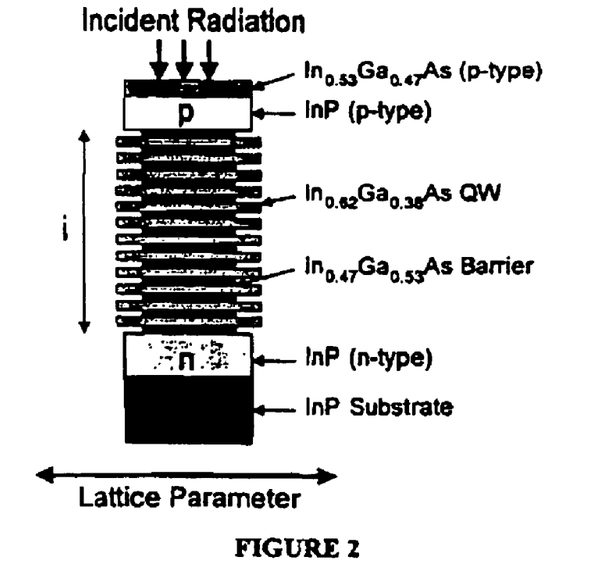
FIG. 2 is a schematic drawing of a strain-compensated quantum well cell where the width indicates the lattice parameter of the material when unstrained.
Figure 3:
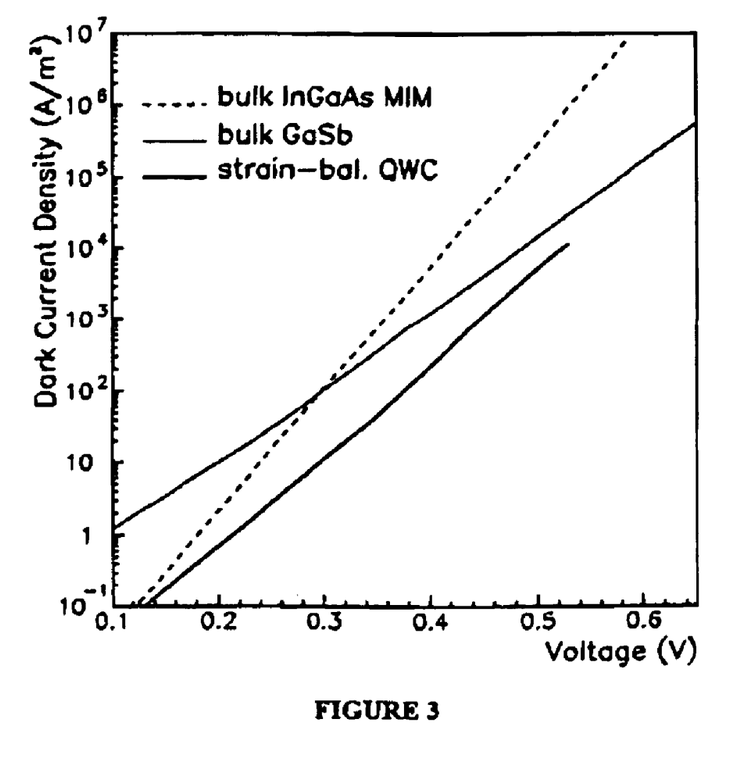
FIG. 3 is a graph of dark current densities of a strain-balanced quantum well cell (as depicted in FIG. 2 but with 30 quantum wells) compared with bulk GaSb of similar effective bandgap (see FIG. 4) and lattice-matched bulk InGaAs.
Figure 4:
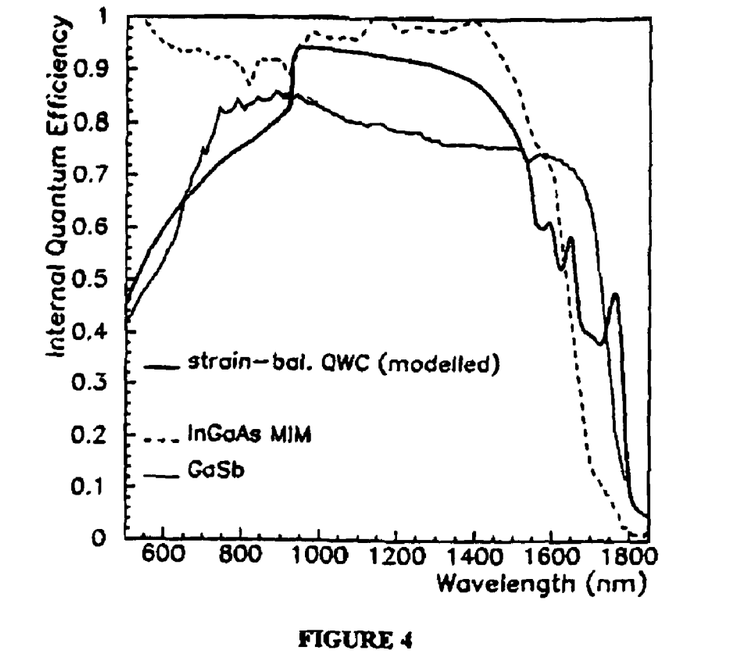
FIG. 4 is a graph of modeled internal quantum efficiency (with back-surface reflector) of a strain-balanced quantum well cell (as depicted in FIG. 2 but with 30 quantum wells) compared with bulk GaSb and lattice-matched bulk InGaAs.

In FIG. 2 the strain-balancing conditions of one example are shown, where the average lattice-constant of wells and barriers is roughly the same as the InP substrate. FIG. 1 shows a schematic diagram of the energy band-gaps of this kind of structure. This specific sample was not designed for TPV applications; the p-region, for example, is far too thick. It does not quite fulfill the ideal strain-balanced conditions, but is close enough to avoid strain relaxation, as is evident by the low dark current of the device (see FIG. 3). In fact, the dark current density is even lower than in a very good lattice-matched bulk InGaAs/InP cell [N. S. Fatemi et al., in Proc. 26th IEEE PV specialists conf. (IEEE, USA, 1997), pp. 799-804] as shown in FIG. 3. In FIG. 4 we show the spectral response (SR) (=external quantum efficiency) data of the strain-balanced QWC at zero bias. The effective band-gap, resulting from the material composition and the confinement, is about 1.77 μm, which is well beyond the band-edge of lattice-matched InGaAs. Hence the strain-balanced approach has enabled the absorption threshold to be extended out to 1.77 μm while retaining a dark current more appropriate to a cell with a band-edge of less than 1.65 μm. The band-edge of the strain-balanced QWC is similar to that of a GaSb cell, but it has a lower dark current (see FIG. 3). Strain-balanced QWCs in InGaP/InGaAs on GaAs have demonstrated dark currents comparable to homogenous GaAs cells [N. J. Ekins-Daukes et al., Appl. Phys. Lett. 75, 4195 (1999)]. We have shown (see FIG. 3) that, if anything, $In_xGa_{1-x}As/In_zGa_{1-z}As$ (InP) cells with absorption edges out to 1.77 μm have lower dark currents than bulk InGaAs cells. To obtain even lower dark currents, we need a higher band-gap in the barriers. We can achieve that by using a different material for the barrier, such as $In_xGa_{1-x}As_{1-y}P_y$ with y>0 or GaInP as indicated in FIG. 1, and an example for such a device is given in Table II.

TABLE II

Sample description of a strain-balanced quantum well cell with high bandgap barriers.

| Layers | Thickness (Å) | Material | Function | Doping | Conc. (cm$^{-3}$) |
|---|---|---|---|---|---|
| 1 | 1000 | $In_{0.53}Ga_{0.47}As$ | Cap | p | 1E+19 |
| 1 | 1500 | InP | Emitter | p | 5E+18 |
| 1 | 50 | $Ga_{0.18}In_{0.82}P$ | Barrier | i | |
| 49 | 100 | $Ga_{0.18}In_{0.82}P$ | Barrier | i | |
| 50 | 100 | $In_{0.72}Ga_{0.28}As$ | Well | i | |
| 1 | 50 | $Ga_{0.18}In_{0.82}P$ | Barrier | i | |
| 1 | 5000 | InP | Base | n | 1E+18 |
| | | InP | Substrate | n | |

We have developed a model which calculates the SR of multi-layer $In_xGa_{1-x}As_{1-y}P_y$ devices, lattice-matched to InP (x=0.47 y) [M. Paxman et al., J. Appl. Phys. 74, 614 (1993), C. Rohr et al., in Thermophotovoltaic Generation of Electricity: Fourth NREL Conf., Vol. 460 of AIP Conf. Proc. (American Institute of Physics, Woodbury, N.Y., 1999), pp. 83-92], which has been extended to estimate the SR of strain-balanced $In_xGa_{1-x}As/In_zGa_{1-z}As$ on InP [C. Rohr et al., in Proc. 26th International Symposium on Compound Semiconductors No. 166 in Institute of Physics Conference Series (Institute of Physics Publishing, Bristol and Philadelphia, 2000), pp. 423-426]. The cell efficiency can be determined given the measured dark current data of the cell, assuming superposition of dark and light current. For photovoltaic applications the p-region of a device would typically be as thin as 1500 Å (instead of 7000 Å) in order to increase the light level that reaches the active i-region where carrier separation is most efficient and to reduce free carrier absorption. A mirror on the back of a semi-insulating (i.e. charge neutral) substrate is particularly useful for QWCs as it enhances the well contribution significantly. The effect of such a mirror is simulated by doubling the light pass through the wells. The strain-balanced QWC is modeled with these modifications and, for the purpose of comparison, the reflectivity is removed to show the internal quantum efficiency in FIG. 4.

We compare our strain-balanced QWC as well as our lattice-matched InGaAsP QWCs with lattice-matched InGaAs monolithic interconnected modules (MIMs) [N. S. Fatemi et al., in Proc. 26th IEEE PV specialists conf. (IEEE, USA, 1997), pp. 799-804], one of the best lattice-matched bulk InGaAs/InP TPV cells, and with bulk GaSb [A. W. Bett et al., in Thermophotovoltaic Generation of Electricity: Third NREL Conf., Vol. 401 of AIP Conf. Proc. (American Institute of Physics, Woodbury, N.Y., 1997), pp. 41-53], currently the only material which is being used commercially for TPV applications. To compare efficiencies we assume "typical" TPV conditions of 100 kW/m$^2$ normalized power density, grid shading of 5%, and internal quantum efficiencies for all cells. A back surface reflector is an integral part of MIM technology and particularly useful for QWCs as it enhances the well contribution significantly. It also increases TPV system efficiency because longer wavelength radiation, that is not absorbed by the cell, is reflected back to the source. The efficiency projections for various illuminating spectra are calculated from data presented in FIGS. 3 and 4 and are summarized in Table III. The relative efficiencies are rather more reliable than the absolute values.

TABLE III

Comparison of predicted efficiencies (in %) of bulk InGaAs MIM, GaSb, lattice-matched and strain-balanced quantum well cells with back-mirror using internal quantum efficiencies, under various spectra at 100 kW/m$^2$, and 5% grid shading:

| Spectrum | Bulk InGaAs MIM | Bulk GaSb | InGaAsP QWC | Strain-bal. QWC |
|---|---|---|---|---|
| Solar × 100 | 16 | 16 | 20 | 19 |
| 3200K blackbody | 18 | 18 | 22 | 27 |
| 2000K blackbody | 11 | 11 | 12 | 22 |
| 1500K blackbody | 5.5 | 5.6 | 4.8 | 14 |
| MgO | 13 | 15 | 16 | 41 |
| Ytterbia | 26 | 25 | 42 | 32 |
| Erbia | 37 | 37 | 46 | 43 |
| Holmia | 4.5 | 5.4 | 4.1 | 39 |

The lower dark current of the QWCs (see FIG. 3) is the main reason for their higher efficiencies in Table III. The lattice-matched InGaAsP QWC shows higher efficiencies than the InGaAs MIM and GaSb in all cases except for black-body temperatures below about 2000 K. Higher black-body temperatures, for example 3200 K and the solar spectrum AM1.5 (approximating 5800 K) at 100 times concentration, are favourable for the lattice-matched InGaAsP QWC. At black-body temperatures around 2000 K and below, the strain-balanced QWC outperforms the others. Particularly with the MgO emitter, which was designed for a GaSb cell [L. Ferguson and L. Fraas, in Thermophotovoltaic Generation of Electricity: Third NREL Conference Vol. 401 of AIP Conf. Proc. (American Institute of Physics, Woodbury, N.Y., 1997), pp. 169-179], the strain-balanced QWC is significantly better and shows an efficiency which is about 50% higher than that of a GaSb cell (see Table III).

Figure 5:
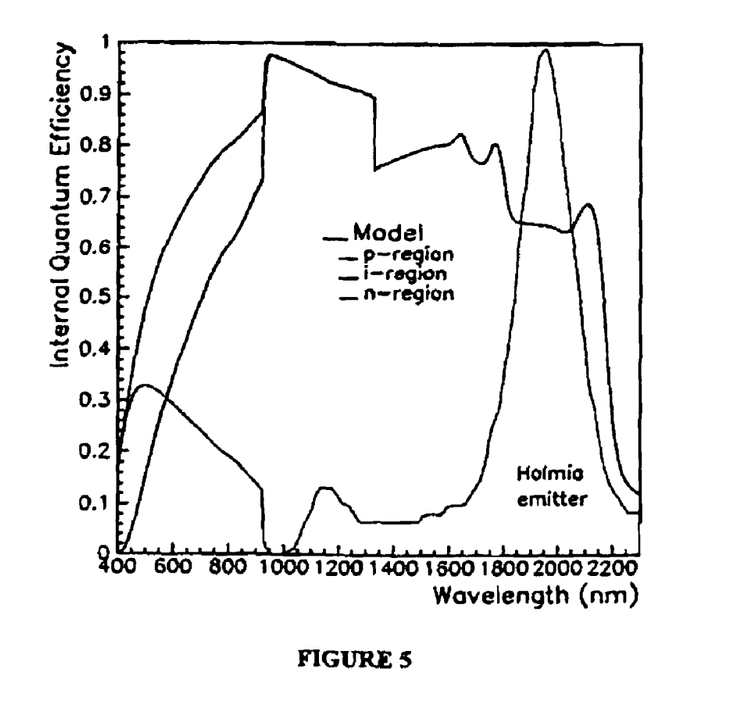
FIG. 5 is a graph of modeled internal quantum efficiency (with back-surface reflector) of a strain-balanced quantum well cell optimized for a Holmia emitter (not to scale).

Based on these results it should be possible to use this concept of strain-balanced QWCs to extend the absorption threshold even further, beyond 2 μm, optimized for TPV applications with a Holmia emitter (see FIG. 5). The efficiency for such a strain-balanced QWC with a Holmia emitter [M. F. Rose et al., Journal of Propulsion and Power 12, 83 (1996)] is predicted to reach 39% under the same conditions as discussed above. The more the band-edge of a PV cell is extended towards longer wavelengths, the more suitable it becomes for lower temperature sources.

The conversion efficiency can be further substantially increased by reducing the dark current. In strain-balanced devices, this can be achieved if higher band-gap material is used for the barriers as indicated in FIG. 1 and Table II.

Figure 6:
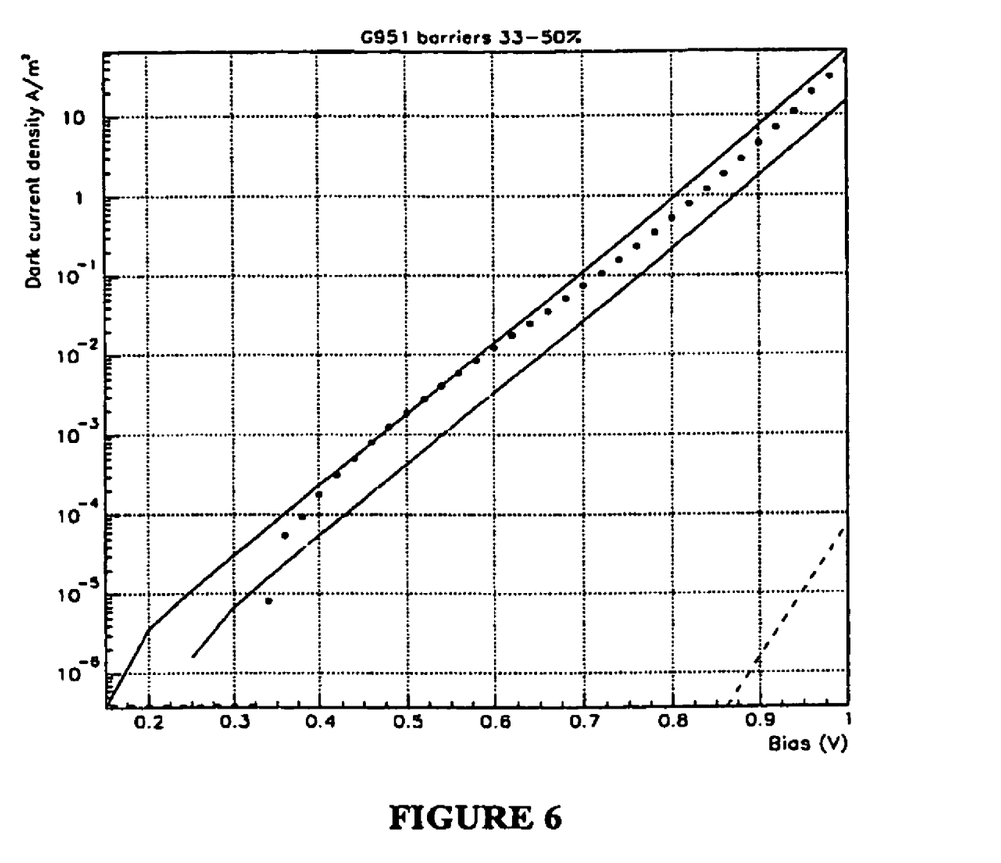
FIG. 6 is a graph of the dark current of an AlGaAs/GaAs quantum well cell, where the data (dots) is fitted (black line). The modeled dark current density for a QWC with a higher band-gap barrier (grey line) is reduced.

A model for the dark current behavior of QWCs is used in FIG. 6. In FIG. 6, a dark current density of an AlGaAs/GaAs quantum well cell is fitted, and it shows that the modeled dark current density for a QWC with a higher band-gap barrier is reduced and hence the efficiency will be increased.

Figure 7:
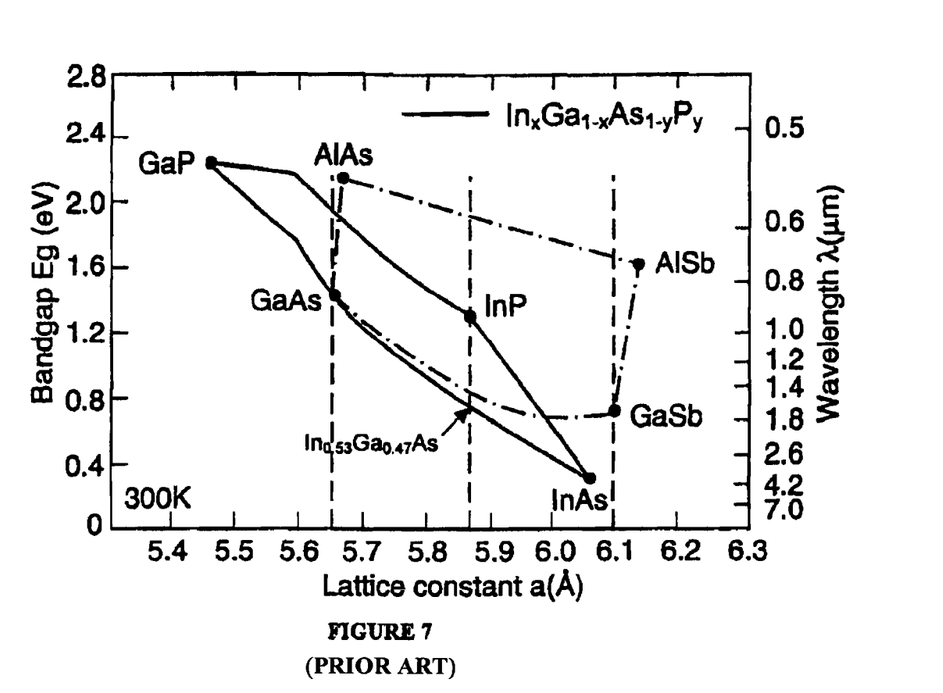
FIG. 7 shows Lattice constant versus Bandgap of the material system $In_xGa_{1-x}As_{1-y}P_y$.

In order to be lattice-matched to an InP substrate, the material composition of $In_xGa_{1-x}As_{1-y}P_y$ must be chosen to lie on the vertical line in FIG. 7 going through InP, which corresponds to x≈0.53+0.47 y. That means, the lowest bandgap one can achieve with lattice-matched material is with $In_{0.53}Ga_{0.47}As$, a bandgap of $E_g \approx 0.74$ eV. Strain-compensation in a multi-layer system allows one to achieve lower effective band-gaps. The quantum wells are compressively strain, going down the branch from $In_{0.53}Ga_{0.47}As$ towards InAs (i.e. x>0.53), and to compensate the barriers have tensile strain going up the branch from $In_{0.53}Ga_{0.47}As$ towards GaAs (i.e. x<0.53). To improve the dark current with higher bandgap barriers one can use material compositions with y>0 and the same lattice constant as before, i.e. going up on a vertical line in FIG. 7. To achieve high bandgap barriers, these may be formed of $Ga_yIn_{1-y}P$, where y>0. In FIG. 7 this composition follows the upper limit between InP and GaP.

By introducing a virtual substrate, still lower bandgaps can be reached as the lattice constant is increased by relaxed buffer layers. This shifts the base or reference line for strain-compensation towards the right in FIG. 7. This virtual substrate can be made of InAsP (upper branch in FIG. 7) [Wilt et al., 28th IEEE PVSC (2000), p. 1024] instead of InGaAs. Such an InAsP buffer is better in confining the dislocations in the virtual substrate, which is crucial for successfully growing a strain-compensated multi-quantum well (MQW) structure on top of it.

The conditions for zero-stress strain-balance may be determined from the following considerations:

The strain $\epsilon$ for each layer i is defined as $$\varepsilon = \frac{a_0 - a_i}{a_i}$$

where $\alpha_0$ is the lattice constant of the substrate (or virtual substrate), and $\alpha_i$ is the natural unstrained lattice constant of layer i.

A strain-balanced structure should be designed such that a single period composed of one tensile and one compressively strained layer, exerts no shear force on its neighbouring layers or substrate. To achieve such a zero stress situation, one needs to taken into account the differences in elastic properties of the layers. Applying linear elastic theory one can derive the following conditions $$\varepsilon_1 t_1 A_1 a_2 + \varepsilon_2 t_2 A_2 a_1 = 0 \quad \text{(zero-stress condition)}$$

$$a_0 = \frac{t_1 A_1 a_1 a_2^2 + t_2 A_2 a_2 a_1^2}{t_1 A_1 a_2^2 + t_2 A_2 a_1^2} \quad \text{(Match substrate lattice constant)}$$

$$A = C_{11} + C_{12} - \frac{2C_{12}^2}{C_{11}} \quad \text{(Layer stiffness)}$$

where $t_1$ and $t_2$ are the thicknesses of layers 1 and 2, and $C_{11}$ and $C_{12}$ are the elastic stiffness coefficients.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A method of forming a photovoltaic device comprising a multiple quantum well portion comprising a plurality of quantum wells and a plurality of barriers, the quantum wells and barriers being disposed on an underlying layer, the barriers alternating with the quantum wells, one of the plurality of quantum wells and the plurality of barriers comprised of tensile strained layers and the other of the plurality of quantum wells and the plurality of barriers comprised of compressively strained layers, the tensile and compressively strained layers having elastic properties, comprising:

selecting compositions and thicknesses of the barriers and quantum wells using an equation taking into account the elastic properties of the tensile strained layers and the compressively strained layers such that each period of one tensile strained layer and one compressively strained layer exerts substantially no shear force on a neighboring structure;

providing the underlying layer; and forming the quantum wells and barriers on the underlying layer according to the derived compositions and thicknesses.

2. The method of claim 1, wherein the neighboring structure is selected from the group consisting of:

a further period of one tensile strained layer and one compressively strained layer; and the underlying layer.

3. The method of claim 2, wherein the underlying layer is selected from the group consisting of:

a layer of arbitrary doping having a lattice constant; and a substrate having a lattice constant.

4. The method of claim 1, wherein the selecting step is carried out using linear elastic theory.

5. The method of claim 1, wherein the number of quantum wells formed is from 30 to 60.

6. The method of claim 1, wherein the underlying layer is a substrate with a substrate lattice constant $\alpha_0$, the alternating tensile strained layers have a lattice constant $\alpha_1$, a thickness $t_1$ and elastic stiffness coefficients $C_{11}$ and $C_{12}$, and the alternating compressively strained layers have a lattice constant $\alpha_2$, a thickness $t_2$ and elastic stiffness coefficients $C_{21}$ and $C_{22}$, the tensile strained layers and the compressively strained layers having compositions and thicknesses selected to substantially meet the conditions:

$$\varepsilon_1 t_1 A_1 a_2 + \varepsilon_2 t_2 A_2 a_1 = 0; \text{ and}$$

$$a_0 = \frac{t_1 A_1 a_1 a_2^2 + t_2 A_2 a_2 a_1^2}{t_1 A_1 a_2^2 + t_2 A_2 a_1^2};$$

where $$A_1 = C_{11} + C_{12} - \frac{2C_{12}^2}{C_{11}};$$

$$A_2 = C_{21} + C_{22} - \frac{2C_{22}^2}{C_{21}};$$

$$\varepsilon_1 = \frac{a_0 - a_1}{a_1}; \text{ and}$$

$$\varepsilon_2 = \frac{a_0 - a_2}{a_2}.$$

7. The method of claim 1, wherein the photovoltaic device is a crystalline photovoltaic device grown upon a substrate with a substrate lattice constant.

8. The method of claim 7, wherein at least one of the tensile strained layers or the compressively strained layers is a quantum well having a lattice constant not equal to the substrate lattice constant and having a Group III/V semiconductor composition with a bandgap lower than if the quantum well had a lattice constant equal to the substrate lattice constant.

9. The method of claim 8, wherein the substrate is InP and the compressively strained layer is $In_xGa_{1-x}As$, where x>0.53.

10. The method of claim 7, wherein at least one of the tensile strained layers or the compressively strained layers is a barrier having a lattice constant not equal to the substrate lattice constant and having a Group III/V semiconductor composition with a bandgap higher than if the barrier had a lattice constant equal to the substrate lattice constant.

11. The method of claim 10, wherein the substrate is InP and the tensile strained layer is $In_xGa_{1-x}As_{1-y}P_y$, where y>0.

12. The method of claim 7, wherein the substrate is GaAs.

13. The method of claim 12, wherein the multiple quantum well portion is formed of layers of $In_xGa_{1-x}As_yP_{1-y}$, where $0 \leq x \leq 1$ and $0 \leq y \leq 1$.

14. The method of claim 1, wherein the multiple quantum well portion is formed of alternating quantum well layers and barrier layers having a Group III/V semiconductor composition, wherein a period of one quantum well layer and one quantum barrier layer contains at least four different elements and has an average lattice constant substantially matching a neighboring structure lattice constant.

15. The method of claim 1, wherein the multiple quantum well portion is formed upon a virtual substrate composed of a strain relaxed buffer layer having a virtual substrate lattice constant different from a substrate lattice constant of an underlying substrate.

16. The method of claim 1, wherein the photovoltaic device is a thermophotovoltaic device.

17. The method of claim 1, wherein the quantum wells comprise the compressively strained layers.

18. The method of claim 1, wherein the barriers comprises the tensile strained layers.

19. A method of forming a photovoltaic device comprising:
forming a plurality of alternating tensile strained layers and compressively strained layers on an underlying layer of material, the alternating layers comprising barriers and quantum wells having compositions and thicknesses selected based on their elastic properties;
wherein each period of one tensile strained layer and one compressively strained layer exerts substantially no shear force on a neighboring structure.

20. The method of claim 19, wherein the step of forming a plurality of alternating tensile strained layers and compressively strained layers comprises forming between 30 and 60 quantum wells.

21. The method of claim 19, wherein the neighboring structure is the underlying layer.

22. The method of claim 19, wherein the neighboring structure is another period of one tensile strained layer and one compressively strained layer.

23. The method of claim 19, wherein the underlying layer of material is selected from the group consisting of a layer of arbitrary doping having a lattice constant and a substrate having a lattice constant.

24. The method of claim 19, further comprising the step of selecting the compositions and thicknesses of the barriers and quantum wells using linear elastic theory.

25. The method of claim 19, wherein the underlying layer of material is a substrate with a substrate lattice constant $\alpha_0$, the alternating tensile strained layers have a lattice constant $\alpha_1$, a thickness $t_1$ and elastic stiffness coefficients $C_{11}$ and $C_{12}$, and the alternating compressively strained layers have a lattice constant $\alpha_2$, a thickness $t_2$ and elastic stiffness coefficients $C_{21}$ and $C_{22}$, the tensile strained layers and the compressively strained layers having compositions and thicknesses selected to substantially meet the conditions:

$$\varepsilon_1 t_1 A_1 a_2 + \varepsilon_2 t_2 A_2 a_1 = 0; \text{ and}$$

$$a_0 = \frac{t_1 A_1 a_1 a_2^2 + t_2 A_2 a_2 a_1^2}{t_1 A_1 a_2^2 + t_2 A_2 a_1^2};$$

where $$A_1 = C_{11} + C_{12} - \frac{2C_{12}^2}{C_{11}};$$

$$A_2 = C_{21} + C_{22} - \frac{2C_{22}^2}{C_{21}};$$

$$\varepsilon_1 = \frac{a_0 - a_1}{a_1}; \text{ and}$$

$$\varepsilon_2 = \frac{a_0 - a_2}{a_2}.$$

26. The method of claim 19, wherein the photovoltaic device is a crystalline photovoltaic device grown upon a substrate with a substrate lattice constant.

27. The method of claim 26, wherein the substrate is InP and the compressively strained layer is selected from the group consisting of $In_xGa_{1-x}As$ where x>0.53.

28. The method of claim 26, wherein the substrate comprises GaAs.

29. The method of claim 28, wherein the alternating tensile strained layers and the compressively strained layers comprise $In_xGa_{1-x}As_yP_{1-y}$, where $0 \leq x \leq 1$ and $0 \leq y \leq 1$.

30. The method of claim 19, wherein a period of one quantum well layer and one quantum barrier layer within the plurality of alternating tensile strained layers and compressively strained layers contains at least four different elements and has an average lattice constant substantially matching a lattice constant of a neighboring structure.

31. The method of claim 19, wherein the compressively strained layers are quantum wells.

32. A method of forming a photovoltaic device comprising:
forming a plurality of alternating layers of quantum wells and barriers, wherein the alternating layers alternate between tensile strained layers and compressively strained layers, the tensile strained layers and the compressively strained layers having compositions selected based on the elastic properties thereof such that a period of one tensile strained layer and one compressively strained layer exerts substantially no shear force on a neighboring structure, and wherein the number of quantum wells is between 30 and 60.

33. The method of claim 32, wherein the neighboring structure is an underlying layer or another period of one tensile strained layer and one compressively strained layer.

34. The method of claim 32, further comprising the step of selecting the compositions of the quantum wells and barriers using linear elastic theory.

35. The method of claim 32, wherein the step of forming a plurality of alternating layers forms the plurality of alternating layers on a substrate having a substrate lattice constant $\alpha_0$, and wherein the alternating tensile strained layers have a lattice constant $\alpha_1$, a thickness $t_1$ and elastic stiffness coefficients $C_{11}$ and $C_{12}$, and the alternating compressively strained layers have a lattice constant $\alpha_2$, a thickness $t_2$ and elastic stiffness coefficients $C_{21}$ and $C_{22}$, the tensile strained layers and the compressively strained layers having compositions and thicknesses selected to substantially meet the conditions:

$$\varepsilon_1 t_1 A_1 a_2 + \varepsilon_2 t_2 A_2 a_1 = 0;\text{ and}$$

$$a_0 = \frac{t_1 A_1 a_1 a_2^2 + t_2 A_2 a_2 a_1^2}{t_1 A_1 a_2^2 + t_2 A_2 a_1^2};$$

where $$A_1 = C_{11} + C_{12} - \frac{2C_{12}^2}{C_{11}};$$

$$A_2 = C_{21} + C_{22} - \frac{2C_{22}^2}{C_{21}};$$

$$\varepsilon_1 = \frac{a_0 - a_1}{a_1};\text{ and}$$

$$\varepsilon_2 = \frac{a_0 - a_2}{a_2}.$$

36. The method of claim 35, wherein the substrate is InP.

37. The method of claim 35, wherein the substrate comprises GaAs.

38. The method of claim 37, wherein the quantum wells and barriers comprise $In_xGa_{1-x}As_yP_{1-y}$, where $0 \leq x \leq 1$ and $0 \leq y \leq 1$.

39. The method of claim 32, wherein a period of one quantum well layer and one quantum barrier layer within the plurality of alternating tensile strained layers and compressively strained layers contains at least four different elements and has an average lattice constant substantially matching a lattice constant of a neighboring structure.

40. The method of claim 32, wherein the compressively strained layers are quantum wells.

* * * * *

UNITED STATES PATENT AND TRADEMARK OFFICE
CERTIFICATE OF CORRECTION

PATENT NO. : 7,868,247 B2  Page 1 of 1
APPLICATION NO. : 12/078315
DATED : January 11, 2011
INVENTOR(S) : Carsten Rohr et al.

It is certified that error appears in the above-identified patent and that said Letters Patent is hereby corrected as shown below:

Specification:
Column 7, Line 30, replace "$α_0$" with --$a_0$--.
Column 7, Line 31, replace "$α_i$" with --$a_i$--.

Claim 6:
Column 8, Line 33, replace "$α_0$" with --$a_0$--.
Column 8, Line 34, replace "$α_1$" with --$a_1$--.
Column 8, Line 37, replace "$α_2$" with --$a_2$--.

Claim 25:
Column 9, Line 60, replace "$α_0$" with --$a_0$--.
Column 9, Line 62, replace "$α_1$" with --$a_1$--.
Column 9, Line 64, replace "$α_2$" with --$a_2$--.

Claim 35:
Column 10, Line 60, replace "$α_0$" with --$a_0$--.
Column 10, Line 62, replace "$α_1$" with --$a_1$--.
Column 10, Line 64, replace "$α_2$" with --$a_2$--.

Signed and Sealed this
Twenty-fourth Day of May, 2011

David J. Kappos
*Director of the United States Patent and Trademark Office*